United States Patent
Sun et al.

(10) Patent No.: US 10,164,147 B2
(45) Date of Patent: Dec. 25, 2018

(54) NON-UNIFORM SUPERLATTICE STRUCTURE

(71) Applicant: Sensor Electronic Technology, Inc., Columbia, SC (US)

(72) Inventors: Wenhong Sun, Columbia, SC (US); Alexander Dobrinsky, Loudonville, NY (US); Maxim S. Shatalov, Columbia, SC (US); Jinwei Yang, Columbia, SC (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 15/662,675

(22) Filed: Jul. 28, 2017

(65) Prior Publication Data

US 2017/0345968 A1  Nov. 30, 2017

Related U.S. Application Data

(63) Continuation of application No. 13/863,423, filed on Apr. 16, 2013, now Pat. No. 9,722,139.

(Continued)

(51) Int. Cl.
*H01L 33/06* (2010.01)
*H01L 33/00* (2010.01)
(Continued)

(52) U.S. Cl.
CPC .......... *H01L 33/06* (2013.01); *H01L 33/0066* (2013.01); *H01L 21/02389* (2013.01);
(Continued)

(58) Field of Classification Search
CPC . H01L 33/06; H01L 33/0066; H01L 33/0075; H01L 33/04; H01L 21/02389;
(Continued)

(56) References Cited

U.S. PATENT DOCUMENTS 5,306,924 A   4/1994 Usami et al.
5,519,721 A   5/1996 Takano
(Continued)

FOREIGN PATENT DOCUMENTS

EP   1 883 121 A2 *  7/2007  ............. H01L 33/04
EP   1 883 122 A2 *  1/2008  ............. H01L 33/04
(Continued)

OTHER PUBLICATIONS

Ambacher, "Growth and applications of group III-nitrides", J. Phys. D: Appl. Phys. 31, 1998, pp. 2653-2710.
(Continued)

*Primary Examiner* — Cheung Lee
*Assistant Examiner* — Stephen C Smith
(74) *Attorney, Agent, or Firm* — LaBatt, LLC

(57) ABSTRACT

A light emitting heterostructure including one or more fine structure regions is provided. The light emitting heterostructure can include a plurality of barriers alternating with a plurality of quantum wells. One or more of the barriers and/or quantum wells includes a fine structure region. The fine structure region includes a plurality of subscale features arranged in at least one of: a growth or a lateral direction.

20 Claims, 11 Drawing Sheets

Related U.S. Application Data

(60) Provisional application No. 61/624,683, filed on Apr. 16, 2012.

(51) Int. Cl.
   H01L 33/04 (2010.01)
   H01L 21/02 (2006.01)

(52) U.S. Cl.
   CPC .. *H01L 21/02505* (2013.01); *H01L 21/02507* (2013.01); *H01L 21/02513* (2013.01); *H01L 33/0075* (2013.01); *H01L 33/04* (2013.01)

(58) Field of Classification Search
   CPC ......... H01L 21/02505; H01L 21/02507; H01L 21/02513
   See application file for complete search history.

(56) References Cited

U.S. PATENT DOCUMENTS

| | | | |
|---|---|---|---|
| 6,066,859 | A | 5/2000 | Stegmueller |
| 6,108,360 | A | 8/2000 | Razeghi |
| 6,597,017 | B1 | 7/2003 | Seko et al. |
| 6,803,597 | B2 | 10/2004 | Watatani et al. |
| 6,925,103 | B2 | 8/2005 | Ishikawa et al. |
| 7,312,474 | B2 | 12/2007 | Emerson et al. |
| 7,326,963 | B2 | 2/2008 | Gaska et al. |
| 7,811,847 | B2 | 10/2010 | Hirayama et al. |
| 7,983,317 | B2 | 7/2011 | Bhat et al. |
| 8,120,012 | B2 | 2/2012 | Chua et al. |
| 8,188,458 | B2 | 5/2012 | Craven et al. |
| 8,237,175 | B2 | 8/2012 | Moustakas et al. |
| 8,563,995 | B2 | 10/2013 | Khan et al. |
| 8,575,592 | B2 * | 11/2013 | Bergmann ............... H01L 33/04 257/13 |
| 8,698,127 | B2 | 4/2014 | Shur et al. |
| 9,722,139 | B2 | 8/2017 | Sun et al. |
| 2006/0169990 | A1 * | 8/2006 | Taki ........................ B82Y 20/00 257/79 |
| 2007/0085097 | A1 * | 4/2007 | Kim ........................ B82Y 20/00 257/94 |
| 2007/0187677 | A1 | 8/2007 | Park et al. |
| 2008/0237570 | A1 | 10/2008 | Choi et al. |
| 2009/0321781 | A1 | 12/2009 | Broadley et al. |
| 2011/0143507 | A1 | 6/2011 | Mun et al. |
| 2011/0198641 | A1 | 8/2011 | Yahata et al. |
| 2011/0227039 | A1 * | 9/2011 | Moon .................... B82Y 20/00 257/13 |
| 2012/0012814 | A1 * | 1/2012 | Harada ............. H01L 21/02458 257/13 |
| 2012/0126198 | A1 | 5/2012 | Nakamura et al. |
| 2013/0187125 | A1 | 7/2013 | Yeh et al. |

FOREIGN PATENT DOCUMENTS

| | | | |
|---|---|---|---|
| EP | 1883121 | A2 | 1/2008 |
| EP | 1883122 | A2 | 1/2008 |
| EP | 1976031 | A2 | 10/2008 |
| EP | 2339652 | A2 | 6/2011 |
| JP | 1998290049 | A | 10/1998 |
| JP | 1998321965 | A | 12/1998 |
| JP | 1999204885 | A | 7/1999 |
| JP | 2005277401 | A | 10/2005 |
| JP | 2009054780 | A | 3/2009 |
| JP | 2010182977 | A | 8/2010 |
| KR | 100363241 | B1 | 11/2002 |
| KR | 20080088221 | A | 10/2008 |
| KR | 20100067504 | A | 6/2010 |

OTHER PUBLICATIONS

Bai et al., "Reduction of threading dislocation densities in AlN/sapphire epilayers driven by growth mode modification", Applied Physics Letters, 2006, pp. 051903, vol. 88, No. 5.

Edgar, J., "Properties of Group III nitrides", 1994, (Only the description and Table of Contents are available), published by INSPEC, the Institution of Electrical Engineers, London, United Kingdom.

Ellis et al., "Binary superlallice quantum-well infrared photodetectors for long-wavelength broadband detection", Applied Physics Letters, 2004, pp. 5127-5129, vol. 84, No. 25.

Fareed et al., "Migration enhanced metal organic chemical vapor deposition of AlN/GaN/InN-based heterostructures", Semiconductor Device Research Symposium, 2003, pp. 402-403.

Hatefi-Kargan et al., "A Superlattice Barrier Based Quantum Well Infrared Photodetector With Maximum Sensitivity at Mid-Infrared Wavelengths," Proceedings of Symposium on Photonics and Optoelectronics 2010, pp. 1-3.

Lamberti et al., "Structural and Optical Investigation of InAsP/InP Strained Superlattices," Journal of Applied Physics, 83 (2), Jan. 15, 1998, p. 1058-1077.

Lee et al., "Quantum-well infrared photodetectors with digital graded superlattice barrier for long-wavelength and broadband detection", Applied Physics Letters, 1999, pp. 3207-3209, vol. 75, No. 20.

Robins, L.H., et al., "Optical and Structural Studies of Compositional Inhomogeneity in Strain-Relaxed Indium Gallium Nitride Films," IEEE Symposium on Compound Semiconductors, 2000, pp. 507-512.

Rumyantsev et al., "Materials Properties of Nitrides, Summary", International Journal of High Speed Electronics and Systems, 2004, pp. 1-19.

Stringfellow, "Microstructures Produced During the Epitaxial Growth of InGan Alloys," Journal of Crystal Growth, 2010, pp. 735-749, vol. 312.

Sun et al., "Fine Structure of AlN/AlGaN Superlattice Grown by Pulsed Atomic Layer Epitaxy for dislocation filtering", Applied Physics Letters, 2005, pp. 211915, vol. 87.

Zhang et al., "High-quality AlGaN layers over pulsed atomic-layer epitaxially grown AlN templates for deep ultraviolet light-emitting diodes", 2003, pp. 364-370, vol. 32, No. 5.

Zhang et al., "Pulsed atomic layer epitaxy of quaternary AlInGaN layers", Applied Physics Letters, 2001, pp. 925-927, vol. 79, No. 7.

Smith, S., U.S. Appl. No. 13/863,423, Notice of Allowance, dated Apr. 5, 2017, 13 pages.

Smith, S., U.S. Appl. No. 13/863,423, Final Office Action 2, dated Jun. 3, 2016, 22 pages.

Smith, S., U.S. Appl. No. 13/863,423, Non-Final Office Action 2, dated Jan. 4, 2016, 20 pages.

Smith, S., U.S. Appl. No. 13/863,423, Final Office Action 1, dated Nov. 24, 2014.

Smith, S., U.S. Appl. No. 13/863,423, Office Action 1, dated Jun. 20, 2014, 18 pages.

Park, International Search Report and Written Opinion for International Application No. PCT/US2013/036784, dated Jul. 26, 2013, 10 pages.

Application No. JP 2015-505992, Notice of Allowance (English translation is not available), dated Aug. 15, 2017, 3 pages.

Application No. JP 2015-505992, Office Action1, dated Jan. 24, 2017, 3 pages.

Franssen, G., Application No. EP 13 77 8352, "Office Action1," dated Jan. 27, 2017, 5 pages.

Franssen, G., Application No. EP 13 77 8352, "Supplementary European Search Report," dated Oct. 19, 2015, 7 pages.

* cited by examiner

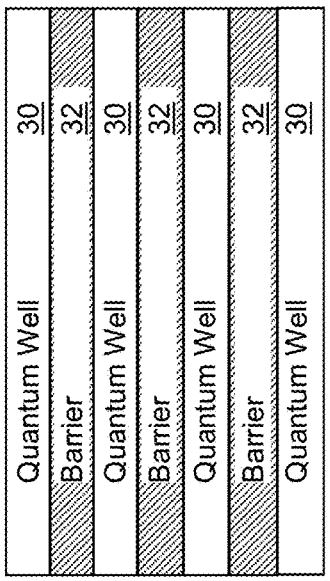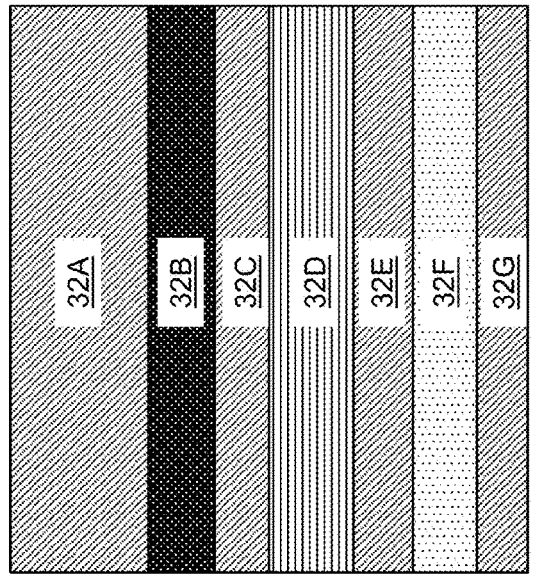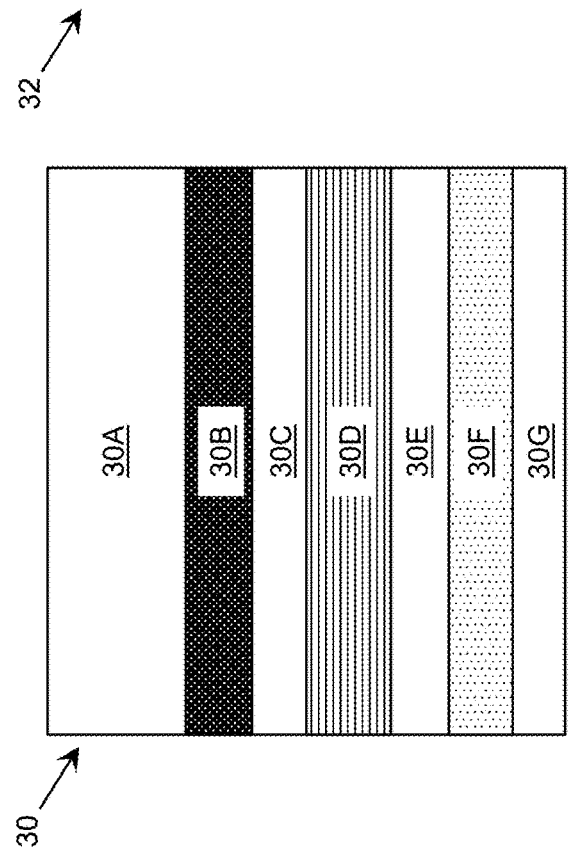
FIG. 3A
FIG. 3B
FIG. 3C

NON-UNIFORM SUPERLATTICE STRUCTURE

REFERENCE TO RELATED APPLICATIONS

The current application is a continuation of U.S. patent application Ser. No. 13/863,423, filed on 16 Apr. 2013, now U.S. Pat. No. 9,722,139, which claims the benefit of U.S. Provisional Application No. 61/624,683, filed on 16 Apr. 2012, each of which is hereby incorporated by reference.

GOVERNMENT LICENSE RIGHTS

This invention was made with government support under contract no. W911NF-10-2-0023 awarded by the Defense Advanced Research Projects Agency (DARPA). The government has certain rights in the invention.

TECHNICAL FIELD

The disclosure relates generally to light emitting devices, and more particularly, to an active region of a light emitting device including a set of fine structure regions.

BACKGROUND ART

Semiconductor emitting devices, such as light emitting diodes (LEDs) and laser diodes (LDs), include, but are not limited to, solid state emitting devices composed of group III-V semiconductors. A subset of group III-V semiconductors includes group III-Nitride alloys, which can include binary, ternary and quaternary alloys of indium (In), aluminum (Al), gallium (Ga), and nitrogen (N). Illustrative group III-Nitride based LEDs and LDs can be of the form $In_yAl_xGa_{1-x-y}N$, where x and y indicate the molar fraction of a given element, $0 \le x$, $y \le 1$, and $0 \le x+y \le 1$. Other illustrative group III-Nitride based LEDs and LDs are based on boron (B) nitride (BN) and can be of the form $Ga_zIn_yAl_xB_{1-x-y-z}N$, where $0 \le x$, y, $z \le 1$, and $0 \le x+y+z \le 1$.

An LED is typically composed of layers. Each layer has a particular combination of molar fractions for the various elements (e.g., given values of x, y, and/or z). An interface between two layers is defined as a semiconductor heterojunction. At an interface, the combination of molar fractions is assumed to change by a discrete amount. A layer in which the combination of molar fractions changes continuously is said to be graded.

Changes in molar fractions of semiconductor alloys allows for band gap control and are used to form barrier and quantum well (QW) layers. A quantum well comprises a semiconducting layer located between two other semiconducting layers, each of which has a larger band gap than the band gap of the quantum well. A difference between a conduction band energy level of a quantum well and a conduction band energy level of the neighboring semiconductor layers is referred to as a depth of a quantum well. In general, the depth of a quantum well can differ for each side of the quantum well. A barrier comprises a semiconductor layer located between two other semiconductor layers, each of which has a smaller band gap than the band gap of the barrier. A difference between a conduction band energy level of a barrier and a conduction band energy level of a neighboring semiconductor layer is referred to as barrier height. In general, the barrier height of a barrier can differ for each side of the barrier.

A stack of semiconductor layers can include several n-type doped layers and one or more p-type doped layers. An active region of an LED is formed in proximity of a p-n junction where electron and hole carriers recombine and emit light. The active region typically includes quantum wells and barriers for carrier localization and improved radiative recombination. Inside a quantum well, electrons and holes are described quantum mechanically in terms of wave functions. Each wave function is associated with a local energy level inside a given quantum well. An overlap of electron and hole wave functions leads to radiative recombination and light production.

An active region contains multiple quantum wells and barriers. At a quantum well/barrier heterojunction, the lattice mismatch of the two semiconductor layers causes stresses and strains of the crystal layers and leads to the possible formation of cracks, threading dislocations, and other defects.

To decrease a buildup in stresses and strains, multilayered semiconductor superlattices (SLs) have been proposed with layers of alternating compression and tensile stresses. The superlattice structures are used during epitaxial growth of semiconductor layers to minimize the presence of threading dislocations and enable growing thick dislocation free semiconductor layers. Nevertheless, this approach has not been used to minimize stresses in the active light emitting layer.

An alternative approach to minimize lattice mismatch stresses and strains includes growing alternative tensile and compressive layers by varying growing modes for the semiconductor layers. Variation in the V-III ratio and temperature results in growth of compressive and tensile layers. Migration enhanced metalorganic chemical vapor deposition (MOCVD) can be employed (with $NH_3$ pulse-flow) to grow high-quality semiconductor layers to reduce threading dislocations.

FIGS. 1A and 1B illustrate an approach for fabricating AlN multilayer buffers on a sapphire substrate according to the prior art. FIG. 1A shows the gas flow sequence used for ammonia ($NH_3$) pulse-flow growth, while FIG. 1B shows a schematic layer structure of the AlN buffer. In a first step, an AlN nucleation layer and an initial AlN layer are deposited by $NH_3$ pulse-flow growth. A low threading dislocation density was achieved by a coalescence process of the AlN nucleation layer. For example, as observed from a cross-sectional transmission electron microscope (TEM) image, edge-type and screw-type dislocation densities of an AlGaN layer on an AlN buffer layer were reported as $3.2 \times 10^9$ and $3.5 \times 10^8$ $cm^{-2}$, respectively.

SUMMARY OF THE INVENTION

Aspects of the invention provide a light emitting heterostructure including one or more fine structure regions. The light emitting heterostructure can include a plurality of barriers alternating with a plurality of quantum wells. One or more of the barriers and/or quantum wells includes a fine structure region. The fine structure region includes a plurality of subscale features arranged in at least one of: a growth or a lateral direction.

A first aspect of the invention provides a device comprising: a semiconductor structure including an active region, wherein the active region comprises a light emitting heterostructure including: a plurality of barriers alternating with a plurality of quantum wells, wherein at least one of: a barrier in the plurality of barriers or a quantum well in the plurality of quantum wells includes a fine structure region, wherein the fine structure region includes a plurality of subscale features arranged in at least one of: a growth or a lateral direction.

A second aspect of the invention provides a device comprising: a semiconductor structure including an active region, wherein the active region comprises a light emitting heterostructure including: a plurality of barriers alternating with a plurality of quantum wells, wherein at least one of: a barrier in the plurality of barriers or a quantum well in the plurality of quantum wells includes a fine structure region, wherein the fine structure region includes a plurality of subscale features having alternating compressive and tensile stresses.

A third aspect of the invention provides a method comprising: forming an active region of a semiconductor structure, wherein the active region comprises a light emitting heterostructure, the forming including: forming a plurality of barriers alternating with a plurality of quantum wells, wherein forming at least one of: a barrier in the plurality of barriers or a quantum well in the plurality of quantum wells includes forming a fine structure region in the at least one of: the barrier in the plurality of barriers or the quantum well in the plurality of quantum wells, and wherein the fine structure region includes a plurality of subscale features arranged in at least one of: a growth or a lateral direction.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 3A-3C show illustrative configurations of an active region according to embodiments.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Most of the previous approaches utilize alternating tensile and compressive layers to minimize dislocations in thick semiconductor layers. The inventors propose to use alternating tensile and compressive layers to minimize stresses and strains in active light emitting layers containing multiple deep quantum wells and high barriers for efficient carrier trapping.

As indicated above, aspects of the invention provide a light emitting heterostructure including one or more fine structure regions. The light emitting heterostructure can include a plurality of barriers alternating with a plurality of quantum wells. One or more of the barriers and/or quantum wells includes a fine structure region. The fine structure region includes a plurality of subscale features arranged in at least one of: a growth or a lateral direction. In an embodiment, the fine structure region(s) can be configured to reduce threading dislocations, cracks, and/or other defects in the active region. Furthermore, the fine structure region(s) can improve a carrier injection efficiency through an improved carrier localization. In this manner, the corresponding light emitting device (e.g., a deep ultraviolet light emitting diode) can have an increased efficiency over prior art devices. As used herein, unless otherwise noted, the term "set" means one or more (i.e., at least one) and the phrase "any solution" means any now known or later developed solution.

Figure 2:
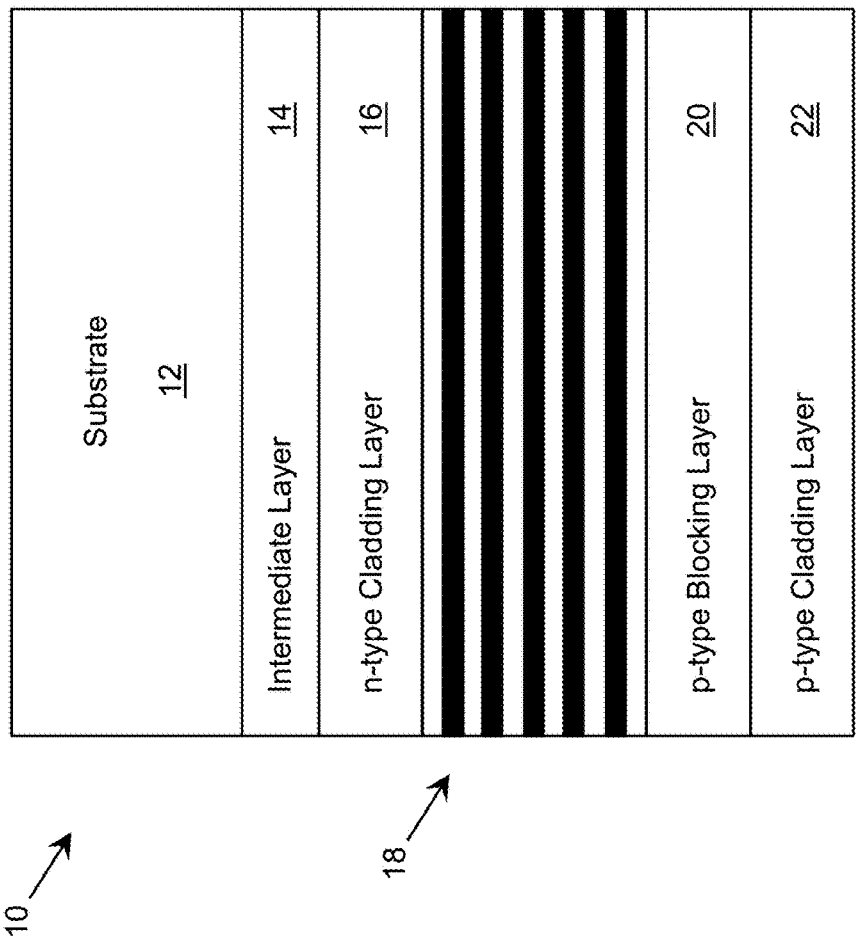
FIG. 2 shows an illustrative design of an emitting device according to an embodiment.

Turning to the drawings, FIG. 2 shows an illustrative design of an emitting device 10 according to an embodiment. In a more particular embodiment, the emitting device 10 is configured to operate as a light emitting diode (LED), such as a conventional or super luminescent LED. Alternatively, the emitting device 10 can be configured to operate as a laser diode (LD). In either case, during operation of the emitting device 10, application of a bias comparable to the band gap results in the emission of electromagnetic radiation from an active region 18 of the emitting device 10. The electromagnetic radiation emitted by the emitting device 10 can comprise a peak wavelength within any range of wavelengths, including visible light, ultraviolet radiation, deep ultraviolet radiation, infrared light, and/or the like.

As illustrated, the emitting device 10 includes a heterostructure comprising a substrate 12, an intermediate layer 14 (e.g., a buffer layer) adjacent to the substrate 12, an n-type cladding layer 16 (e.g., an electron supply layer) adjacent to the intermediate layer 14, and an active region 18 adjacent to the n-type cladding layer 16. Furthermore, the heterostructure of the emitting device 10 includes a p-type blocking layer 20 (e.g., an electron blocking layer) adjacent to the active region 18 and a p-type cladding layer 22 (e.g., a hole supply layer) adjacent to the p-type blocking layer 20.

In a more particular illustrative embodiment, the emitting device 10 is a group III-V materials based device, in which some or all of the various layers are formed of elements selected from the group III-V materials system. In a still more particular illustrative embodiment, the various layers of the emitting device 10 are formed of group III nitride based materials. Group III nitride materials comprise one or more group III elements (e.g., boron (B), aluminum (Al), gallium (Ga), and indium (In)) and nitrogen (N), such that $B_W Al_X Ga_Y In_Z N$, where $0 \leq W, X, Y, Z \leq 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements.

An illustrative embodiment of a group III nitride based emitting device 10 includes an active region 18 (e.g., a series of alternating quantum wells and barriers) composed of $In_y Al_x Ga_{1-x-y} N$, $Ga_z In_y Al_x B_{1-x-y-z} N$, an $Al_x Ga_{1-x} N$ semiconductor alloy, or the like. Similarly, both the n-type cladding layer 16 and the p-type blocking layer 20 can be composed of an $In_y Al_x Ga_{1-x-y} N$ alloy, a $Ga_z In_y Al_x B_{1-x-y-z} N$ alloy, or the like. The molar fractions given by x, y, and z can vary between the various layers 16, 18, and 20. The substrate 12 can be sapphire, silicon (Si), germanium, silicon carbide (SiC), a bulk semiconductor template material, such as AlN, GaN, BN, AlGaN, AlInN, AlON, $LiGaO_2$, AlGaBN, AlGaInN, AlGaInBN, and/or the like, or another suitable material, and can be polar, non-polar, or semi-polar. The intermediate layer 14 can be composed of AlN, AlGaN, AlInN, AlGaBN, AlGaInN, AlGaInBN, an AlGaN/AlN superlattice, and/or the like.

Performance of the emitting device 10 strongly depends on a density of dislocations in the active region 18. In general, a dislocation can initiate at an interface between the substrate 12 and an adjacent layer, such as the intermediate layer 14, and can propagate into the other layers, including the active region 18, due to strain. Furthermore, a dislocation can initiate within the active region 18 due to a large lattice misfit between the quantum wells and barriers located therein. In order to mitigate a probability of dislocations initiating in the active region 18, one or more of the quantum wells and/or barriers can have a set of fine structure regions, each of which includes a plurality of subscale features arranged in a growth and/or a lateral direction.

In an embodiment, a fine structure region includes alternating subscale compressive and tensile layers. FIGS. 3A-3C show illustrative configurations of an active region 18 according to embodiments. As illustrated in FIG. 3A, the active region 18 includes a set of quantum wells 30 alternating with a set of barriers 32. As illustrated in FIGS. 3B and 3C, a quantum well 30 and/or a barrier 32 can include a plurality of regions 30A-30G, 32A-32G, respectively. The plurality of regions 30A-30G, 32A-32G can include one or more fine structure regions including subscale features, such as alternating compressive and tensile epitaxial layers present due to a lattice mismatch between the epitaxial layers. In this case, one epitaxial layer exerts a compressive or tensile stress on the other epitaxial layer.

A lattice mismatch between epitaxial layers can be obtained by changing the lattice constant and/or composition of the semiconductor alloy forming each epitaxial layer using any solution. In an embodiment, the lattice constant and/or composition is changed by changing one or more attributes of a growth mode of neighboring epitaxial layers. For example, the regions 30B, 32B can have a fine structure including compressive and tensile epitaxial layers formed due to varying a group V/III ratio used in growing the epitaxial layers. Furthermore, the regions 30F, 32F can have a fine structure including compressive and tensile epitaxial layers formed due to varying a temperature used in growing the epitaxial layers. The regions 30B, 32B, 30F, and 32F can have the same composition as the region 30 but have different lattice constant(s) than the region 30 due to one or more differences in the growth mode. Additionally, the composition also can be changed by varying a molar fraction of the elements composing the semiconductor epitaxial layers, e.g., forming a superlattice. To this extent, the regions 30D, 32D can have a fine structure due to formation of a superlattice. Similar to the regions 30B, 32B, 30F, and 32F, the changes in composition also lead to changes in the lattice constants of the regions 30D, 32D as compared to the lattice constant of the region 30.

It is understood that while the illustrative quantum well 30 and barrier 32 are shown including three fine structure regions, each formed using a different solution for changing the composition and/or the lattice constant, a quantum well 30 and/or barrier 32 can include any number of one or more fine structure regions, each of which can be formed using any solution for changing the composition and/or the lattice constant. Furthermore, it is understood that an active region 18 can include one or more quantum wells 30 and/or barriers 32 that do not include a fine structure region and/or the fine structure region(s) for quantum wells 30 and/or barriers 32 in the active region 18 can be formed using the same or different solutions, have the same or different configurations, and/or the like. In an embodiment, the active region 18 comprises a substantially uniform distribution of tensile and compressive fine structure regions throughout the active region 18. In this case, tensile and compressive fine structure regions can alternate in the growth and/or lateral directions throughout the active region 18.

Figure 1A:
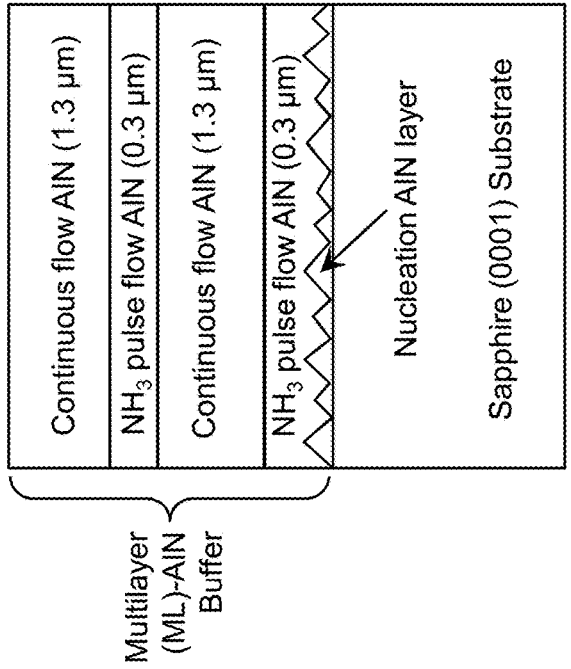
FIGS. 1A and 1B illustrate an approach for fabricating aluminum nitride multilayer buffers on a sapphire substrate according to the prior art.
Figure 1B:
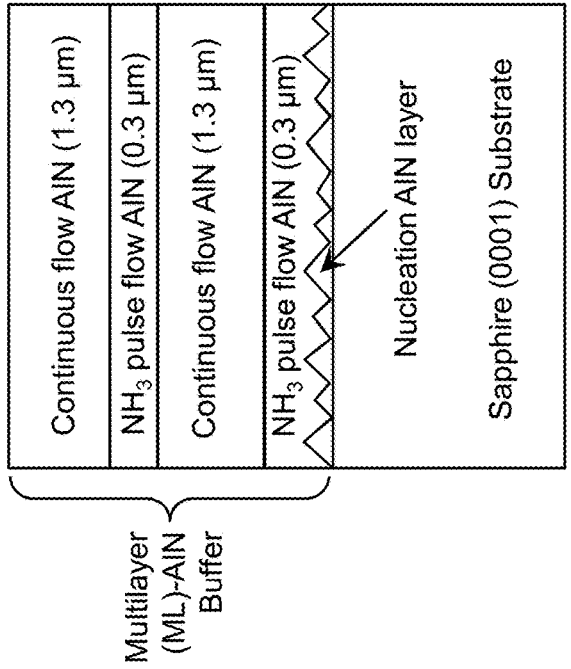
Figure 4A:
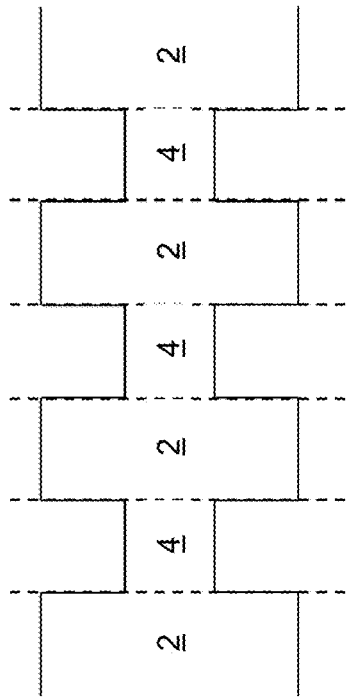
FIGS. 4A-4E show illustrative band diagrams of an active region of an emitting device according to the prior art and embodiments.

FIGS. 4A-4E show illustrative band diagrams of an active region of an emitting device according to the prior art and embodiments. As illustrated in FIG. 4A, a prior art active region of an emitting device includes alternating barriers 2 and quantum wells 4, which result in a band diagram having alternating relatively large gaps between the conductive and valence bands corresponding to the barriers 2, and relatively small gaps between the conductive and valence bands corresponding to the quantum wells 4.

Figure 4C:
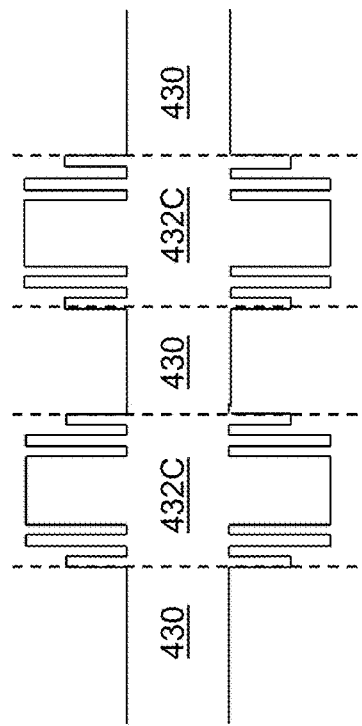
Figure 4E:
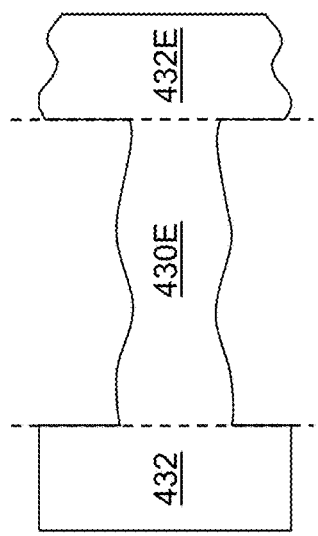
Figure 4B:
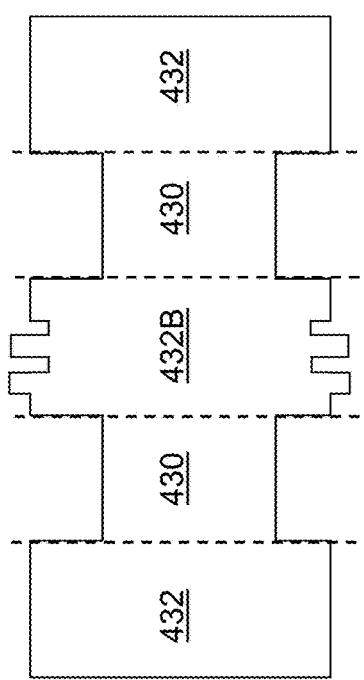
Figure 4D:
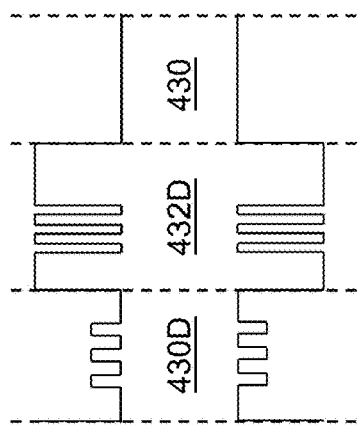

FIGS. 4B-4D show illustrative band diagrams in which one or more of the barriers and/or quantum wells has a set of fine structure regions configured to, e.g., control stress accumulation in the active layer 18 (FIG. 2). FIGS. 4B and 4C show band diagrams resulting from a fine structure region present in barriers 432B and 432C, respectively, while in FIG. 4D, a quantum well 430D and a barrier 432D are shown including a fine structure. The quantum wells 430 and other barriers 432 (in FIG. 4B) do not include the fine structure. In each case, the fine structure regions shown in FIGS. 4B-4D form layered regions, which can be grown by modulation of the group V-III ratio, growth temperature, variation in a composition of the semiconductor layer molar fractions, and/or the like. As illustrated by barriers 432B and 432C, the subscale fine structure regions can comprise quantum wells and barriers of varying depths and/or heights, respectively. In FIG. 4D, the fine structure regions of the quantum well 430D and the barrier 432D can be constructed from superlattices of subscale quantum wells and quantum barriers.

As illustrated, each of the fine structure regions comprises a region having a thickness smaller or comparable to a thickness of the underlying barrier or quantum well structure. To this extent, the barrier 432C is shown including two smaller fine structure regions, each of which is located on an outer portion of the barrier 432C, and each of which comprises approximately one third of a thickness of the barrier 432C. In an illustrative embodiment, a fine structure region can include one or more subscale quantum wells having a thickness between one and fifteen monolayers and/or one or more subscale barriers having a thickness between ten and one hundred monolayers. In the quantum well 430D and the barrier 432D, the corresponding fine structure region is located in the central portion of the layer.

The fine structure region can be configured to create any of various types of energy band non-uniformities. In an embodiment, a fine structure region can comprise subscale quantum wells grown in a barrier region, such as barrier regions 432B-432D. In general, the subscale quantum wells can be thin and/or shallow when compared to a main (conventional) quantum well 430 grown in the active region 18. Furthermore, a fine structure region including subscale quantum wells can be grown in a proximity of a conventional quantum well 430 (e.g., a quantum well 430 grown for the purpose of carrier localization and light emitting through carrier recombination). In another embodiment shown in FIG. 4E, a larger conventional quantum well 430E includes a subscale quantum well located therein, which manifests itself as a fine (slow) variation of the band gap of the quantum well 430E. Similarly, a fine structure region can comprise subscale barrier(s) grown in a barrier or quantum well region. Such a barrier also can manifest itself as a fine variation of a band gap of the barrier region as shown in the barrier region 432E of FIG. 4E. A quantum well and/or barrier can include any number of subscale regions. In an embodiment, a quantum well can include between zero and five subscale regions (e.g., superlattices), while a barrier can include between zero and ten subscale regions (e.g., superlattices). In an embodiment, a band gap variation in a fine structure region is at most approximately one hundred milli-electron volts (meV) per nanometer.

In an embodiment, a layer is selectively grown to exhibit either tensile or compressive residual stress depending on the deposition conditions. For example, a change in a set of the deposition conditions for growing an aluminum nitride (AlN) epitaxial layer can result in the layer exhibiting either tensile or compressive residual stress. In an embodiment, the set of deposition conditions includes a molar ratio of group V precursors to group III precursors (V/III ratio), which can be altered during the growth of a group III-V semiconductor layer.

Whether a layer experiences tensile or compressive stress can depend on the lattice constant of the layer as compared with the lattice constant of each adjacent layer. For example, a first AlN layer with a lattice constant of 3.110 Angstroms grown on a second AlN layer with a lattice constant of 3.108 Angstroms experiences compressive stresses, while the second AlN layer experiences tensile stresses. To this extent, the V/III ratio, or another growth characteristic of a semiconductor layer, may not determine whether or not the layer experiences tensile or compressive stress by itself. In contrast, the growth and/or lattice parameters of adjacent layer(s) may be required to evaluate the stresses present in a given layer.

Unless specified otherwise, a "tensile layer" is a layer experiencing tensile stress, and a "compressive layer" is a layer experiencing compressive stress. Throughout the text, these are also referred to as layers with tensile or compressive stress correspondingly. Additionally, a layer may experience compressive stress at one region (e.g., the bottom) of the layer and tensile stress at another region (e.g., the top) of the layer. In this case, such a layer is referred to as a "mixed stress layer." In general, a "mixed stress layer" is a layer where a sign of the stress changes throughout the layer, in different portions of the layer, and/or the like. It is understood that a target stress can be tensile or compressive.

Figure 5:
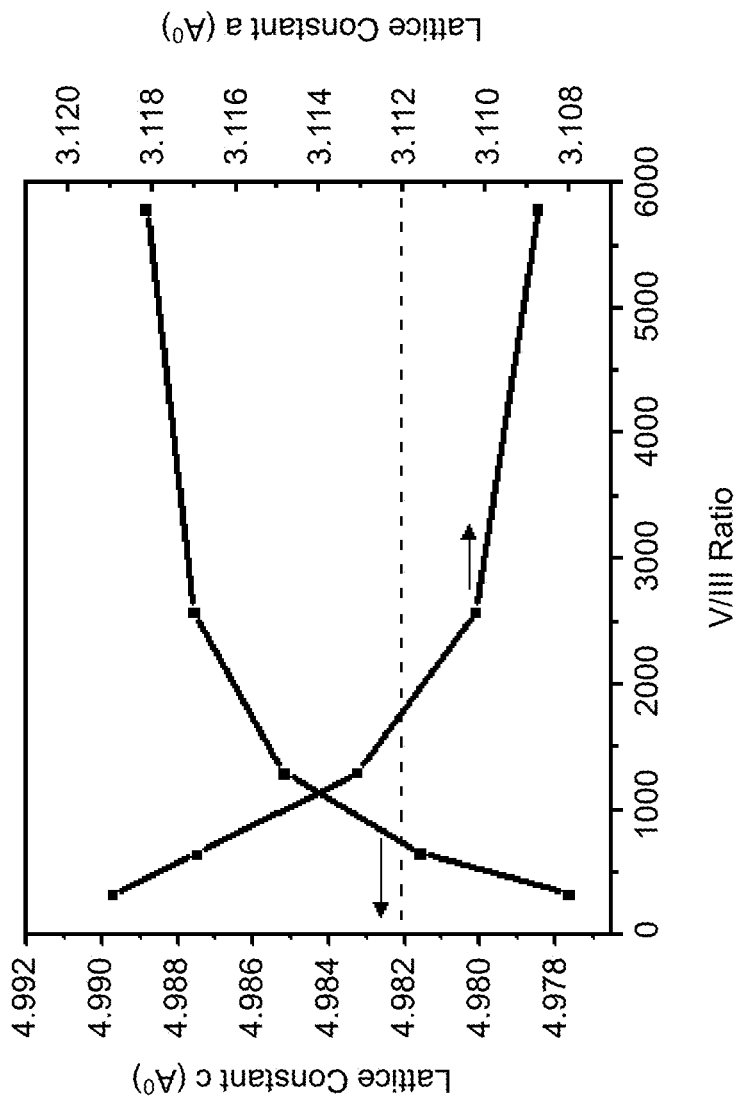
FIG. 5 shows illustrative plots of the lattice constants a and c as a function of the V/III ratio for a group III nitride layer according to an embodiment.

Additional aspects of the invention are shown and described with respect to a default AlN layer grown with a V/III ratio of 1750. Such a layer comprises a lattice constant a of approximately 3.112 Angstroms. To this extent, FIG. 5 shows illustrative plots of the lattice constants a and c as a function of the V/III ratio for a group III nitride layer according to an embodiment. The different lattice constants can result in the layer exerting different tensile and compressive properties when grown adjacent to the default AlN layer. For example, for a group III nitride layer grown using a low V/III ratio (e.g., less than approximately 1750), the lattice constant a for the group III nitride layer is slightly larger than the lattice constant a for the default AlN layer. The difference in the lattice constants a results in the group III nitride layer exerting tensile stresses on the adjacent default AlN layer. For a group III nitride layer grown using a high V/III ratio (e.g., greater than approximately 1750), the lattice constant a for the group III nitride layer is slightly smaller than the lattice constant a for the default AlN layer, which results in compressive stresses being exerted by the group III nitride layer on the adjacent default AlN layer.

Figure 6:
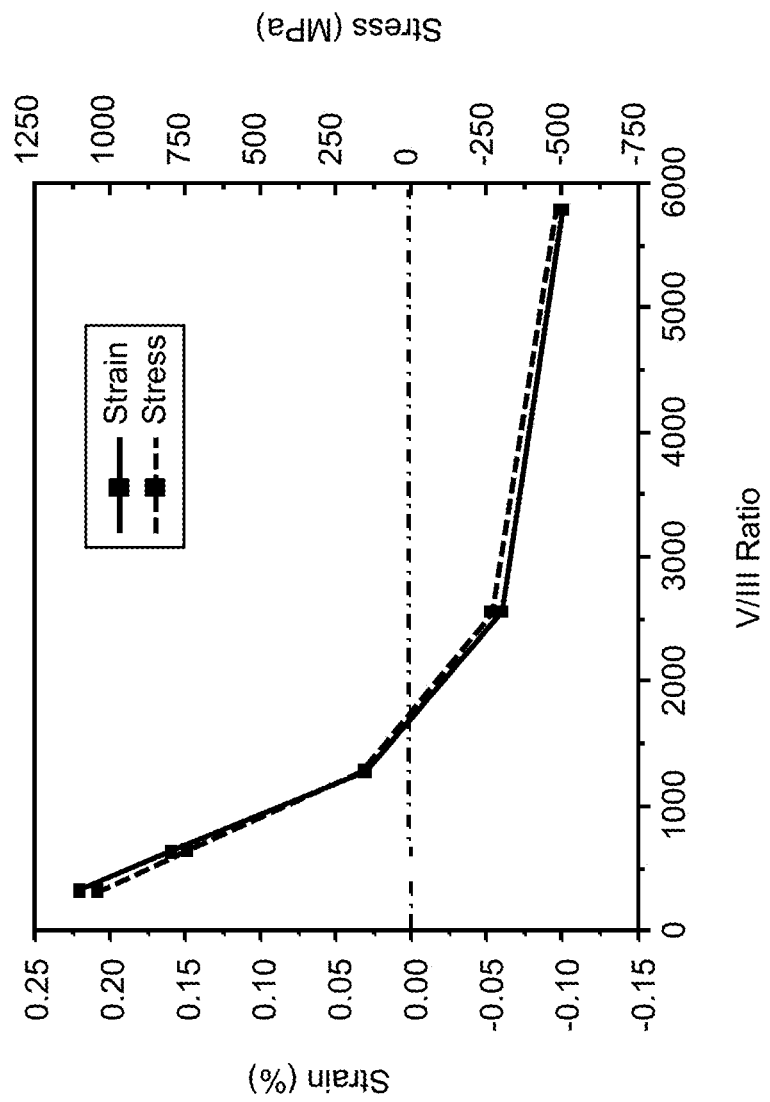
FIG. 6 shows illustrative plots of stress and strain as a function of the V/III ratio for a group III nitride layer according to an embodiment.

FIG. 6 shows illustrative plots of stress and strain as a function of the V/III ratio for a group III nitride layer according to an embodiment. The point of zero strain is chosen to coincide with the default AlN layer having a lattice constant of 3.112 A, which is presumed to be adjacent to the group III nitride layer. All the strains and stresses shown in FIG. 6 are calculated relative to this growth condition. As illustrated, the strain and tensile stresses exerted on the default AlN layer by the group III nitride layer reduce as the V/III ratio is increased, eventually switching from tensile to compressive stress. To this extent, a group III nitride layer grown adjacent to the default AlN layer under a low V/III ratio (e.g., less than approximately 1750) is in compressive stress, while a group III nitride layer grown adjacent to the default AlN layer with a high V/III ratio (e.g., above approximately 1750) is in tensile stress. As further illustrated, only small changes in the strain of the AlN layer are produced by modulating the V/III ratio.

A layer can be selectively configured to have tensile or compressive stress by modulating a V/III ratio in each layer. For example, the modulation can include varying the V/III ratio according to a set schedule to yield compressive and tensile semiconductor layers. Additionally, one or more other deposition conditions can be changed, such as a growth temperature, a gas flow, and/or the like. Furthermore, one or more attributes of the layers, such as a relative thickness of a layer, a distribution of stress within each layer, and/or the like, can be adjusted during the growth of the layer. The modulation of the set of deposition conditions can result in regions of increased compressive stresses and regions of increased tensile stress.

Modulation of the V/III ratio in fine structure regions can control tensile and compressive characteristics of a corresponding layer (e.g., barrier or quantum well). For example, modulating temperature during growth of a group III nitride layer can lead to changes in gallium absorption and create gallium-rich or aluminum-rich tensile or compressive regions. Furthermore, modulation and/or scheduling of metal-organic (MO) precursors can lead to accumulation of gallium-rich and/or aluminum-rich islands constituting laterally discrete subscale quantum wells and barriers.

In an embodiment, a fine structure, such as a superlattice with modulated barrier heights (and/or quantum well depths), is used to introduce modulated alternating tensile and compressive regions into a layer. For example, the barriers 432C (FIG. 4C) are shown having a height that is reduced in a direction towards the barrier/quantum well heterojunction, and increased in a direction away from the quantum well/barrier heterojunction. In this case, rather than the tensile/compressive stress changing abruptly, the tensile/compressive stress can change gradually over some distance.

Figure 7:
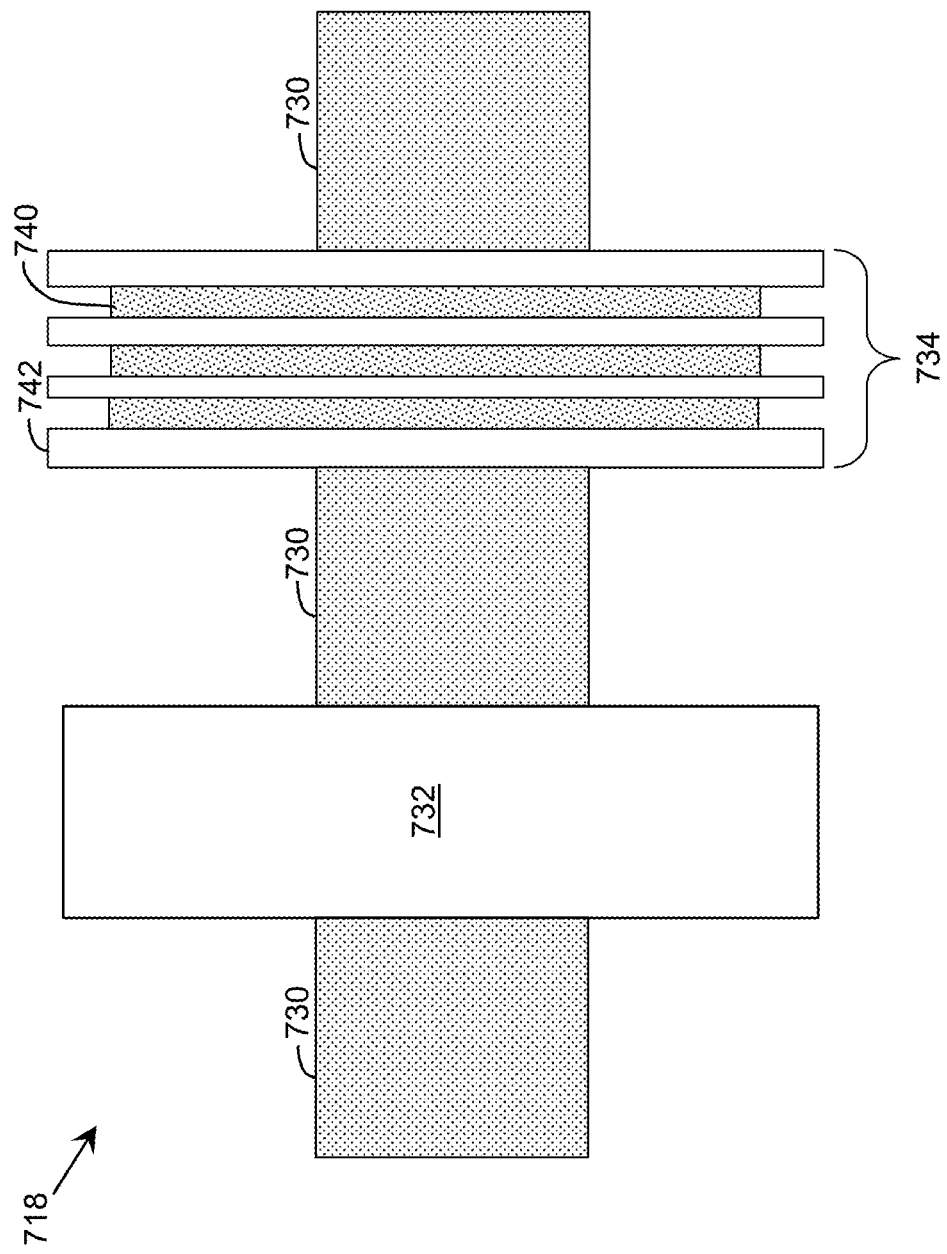
FIG. 7 shows a band diagram for an illustrative active region according to an embodiment.

FIG. 7 shows a band diagram for an illustrative active region 718 according to an embodiment. The active region 718 includes quantum wells 730 alternating with quantum barriers 732, 734. The quantum barrier 734 includes a fine structure superlattice. To this extent, the quantum barrier 734 includes subscale quantum wells 740 alternating with subscale quantum barriers 742. The subscale quantum wells 740 and subscale quantum barriers 742 can form tensile and compressive layers.

For group III nitride based devices, a quantum well 730 is typically formed by epitaxially growing a layer with high gallium content, while a barrier 732 is typically formed by growing a layer with high aluminum content. When the layers are grown adjacent to each other, they form the heterojunction illustrated in FIG. 7. Since an aluminum-rich layer has a lattice constant that is smaller than a gallium-rich layer, the barrier 732 will experience tensile stress when epitaxially grown on a quantum well 730, which is gallium-rich. Conversely, a quantum well 730 will experience compressive stress when epitaxially grown on a barrier 732. To this extent, the barrier 732 can be referred to as a "tensile layer" and the quantum well 730 can be referred to as a "compressive layer."

In order to mitigate large compressive and tensile stresses at a heterojunction of an aluminum-rich barrier 732 and a gallium-rich quantum well 730, the barrier and/or quantum well can include a fine structure. In particular, a barrier (a tensile layer) can include a compressive fine structure incorporated therein and/or a quantum well (a compressive layer) can include a tensile fine structure incorporated therein. For example, the barrier 734 includes a superlattice fine structure including sub-scale quantum wells 740, which can be formed by an increased molar fraction of gallium and/or indium as compared to the sub-scale quantum barriers 742 adjacent thereto. As a result, the sub-scale quantum wells 740 are compressive layers.

In a quantum well 730, a subscale fine structure can be formed by adding aluminum and/or boron, which can lead to the creation of subscale tensile layers in the quantum well 730. Even a small addition of boron can significantly reduce the lattice constant of the underlying semiconductor material. For example, the lattice constant of a quaternary $Al_xB_yGa_{1-x-y}N$ alloy is given by a linear approximation of $$a_s = a_{AlN} \cdot x + a_{BN} \cdot y + a_{GaN} \cdot (1-x-y)$$

with $a_{AlN}$=3.11 Å, $a_{BN}$=2.55, $a_{GaN}$=3.189 Å. Without bowing, a linear band gap approximation for the quaternary alloy is given by:

$$E_s = E_{AlN} \cdot x + E_{BN} \cdot y + E_{GaN} \cdot (1-x-y)$$

with $E_{AlN}$=6.2 eV, $E_{BN}$~5 eV, and $E_{GaN}$=3.42 eV. Consider two semiconductor alloys, one being a ternary alloy, $Al_xGa_{1-x}N$ with a band gap of approximately $E_s = E_{AlN} \cdot x + E_{GaN} \cdot (1-x)$, and the other being a quaternary alloy, $Al_{x'}B_yGa_{1-x'-y}N$, where the quaternary alloy was obtained by a reduction of aluminum and gallium content and addition of boron, and where x' is a new molar fraction of aluminum and y is a new molar fraction of boron. In order for the ternary alloy and the quaternary alloy to have the same band gap for a given value of x, the following relation takes place:

$$y(x'; x) = \frac{E_{AlN} - E_{GaN}}{E_{BN} - E_{GaN}} x - \frac{E_{AlN} - E_{GaN}}{E_{BN} - E_{GaN}} x'$$

Similarly, for the lattice constant of the quaternary alloy, it follows that if a molar fraction of boron y is such that $$y(x'; x) > \frac{a_{GaN} - a_{AlN}}{a_{GaN} - a_{BN}} x - \frac{a_{GaN} - a_{AlN}}{a_{GaN} - a_{BN}} x',$$

than the boron containing layer has a smaller lattice constant than the ternary alloy $Al_xGa_{1-x}N$ (e.g., the quantum well).

Figure 8:
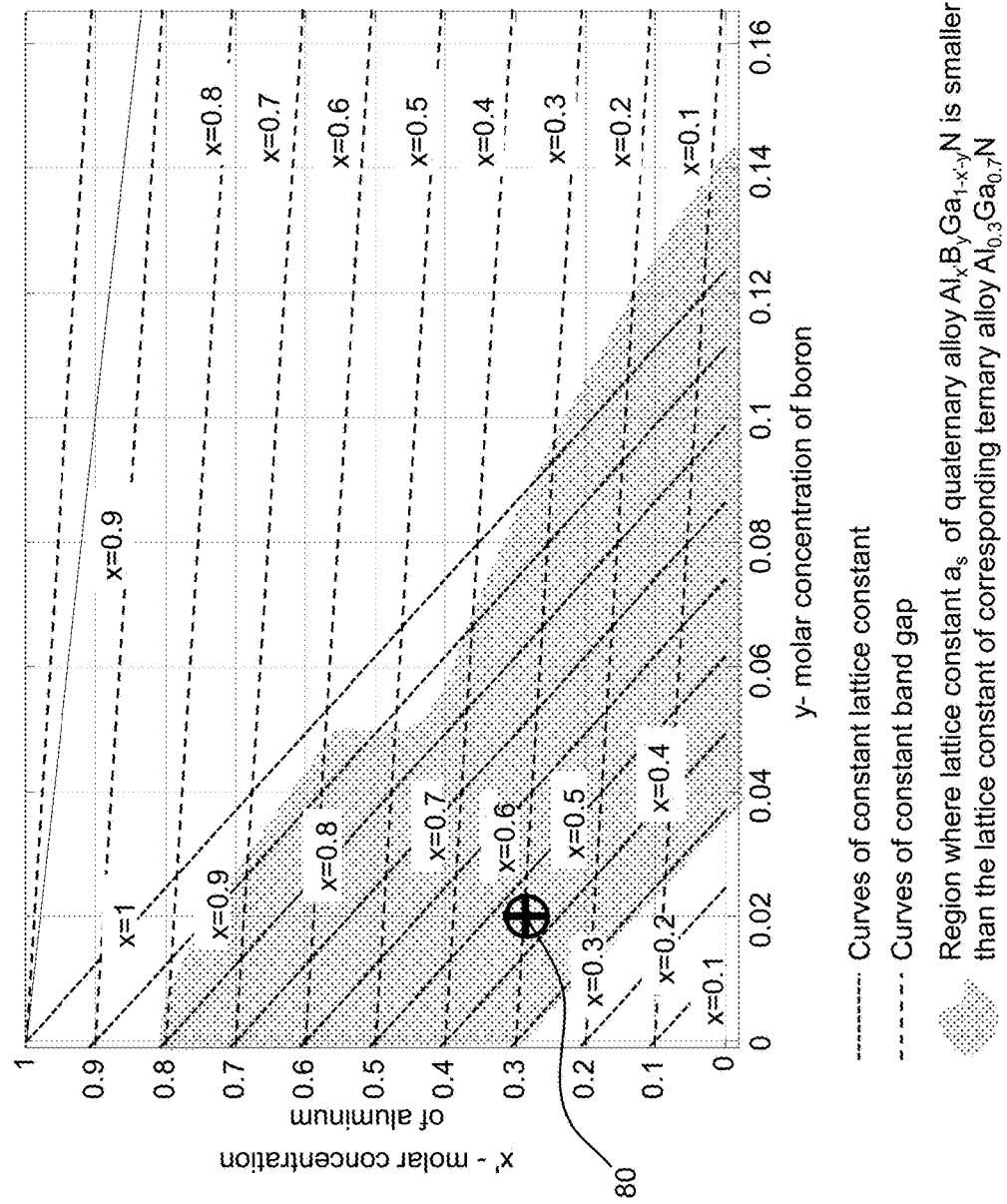
FIG. 8 shows a graph of illustrative energy and lattice relations for a quaternary alloy $Al_xB_yGa_{1-x-y}N$ and compares them with energy and lattice constants of a ternary alloy $Al_{0.3}Ga_{0.7}N$ according to an embodiment.

FIG. 8 shows a graph of illustrative energy and lattice relations for a quaternary alloy $Al_xB_yGa_{1-x-y}N$ and compares them with energy and lattice constants of a ternary alloy $Al_{0.3}Ga_{0.7}N$ according to an embodiment. For example, consider a quantum well composed of the ternary alloy $Al_{0.3}Ga_{0.7}N$. A small addition of boron, without a significant reduction of aluminum (or a significant addition of gallium), will result in a decrease of the lattice constant of the alloy. The region of decreased lattice constants due to a small addition of boron is indicated by the shaded area. In particular, when boron substitutes gallium, the lattice constant is decreased. On the other hand, a small amount of boron can be added without significantly affecting the band gap of the quantum well. For instance, starting with the ternary alloy $Al_{0.3}Ga_{0.7}N$ and adding two percent of boron, reducing both the aluminum and gallium by one percent, results in a quaternary alloy $Al_{0.29}B_{0.02}Ga_{0.69}N$, which has the same band gap as the original ternary alloy $Al_{0.3}Ga_{0.7}N$ (e.g., as indicated by point 80 in the graph).

Figure 9:
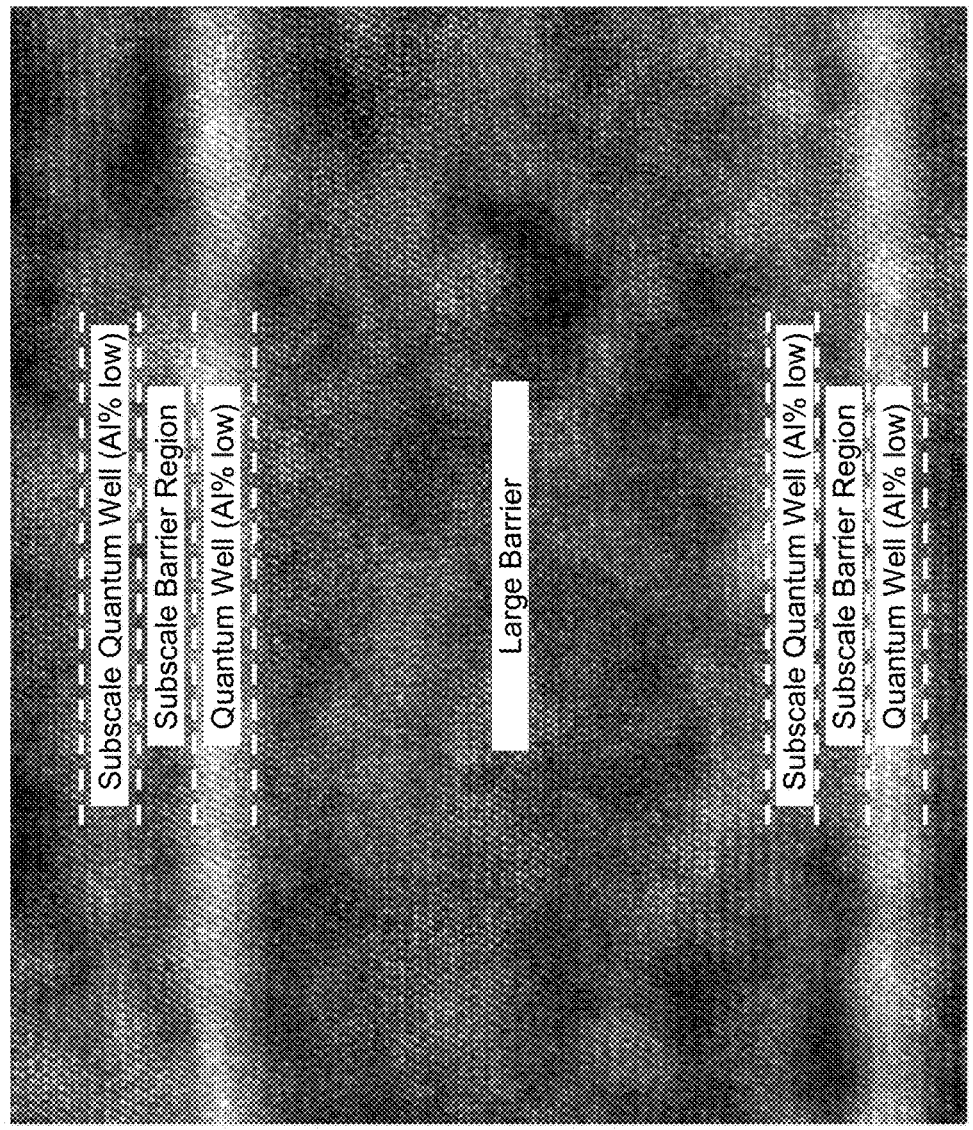
FIG. 9 shows a high resolution transmission electron microscope (HRTEM) image of a cross-section of an active region of a device according to an embodiment.

FIG. 9 shows a high resolution transmission electron microscope (HRTEM) image of a cross-section of an active region of a device according to an embodiment. As described herein, an interface between a quantum well and a large barrier can include a fine scale structure. As illustrated, the fine scale structure can include a subscale barrier region and a subscale quantum well.

In an embodiment, a fine structure region can include one or more laterally discrete subscale features. A laterally discrete subscale feature can comprise a subscale quantum well. A sub-region size of a laterally discrete subscale quantum well can be as small as a few nanometers in both the x and y lateral directions. These quantum well sub-regions can provide high localization carrier recombination domains. Similarly, a laterally discrete subscale feature can comprise a subscale quantum barrier having length scales similar to the laterally discrete subscale quantum wells. In any event, a fine structure region can include a set of laterally discrete subscale quantum wells and a set of laterally discrete subscale quantum barriers.

Figure 10:
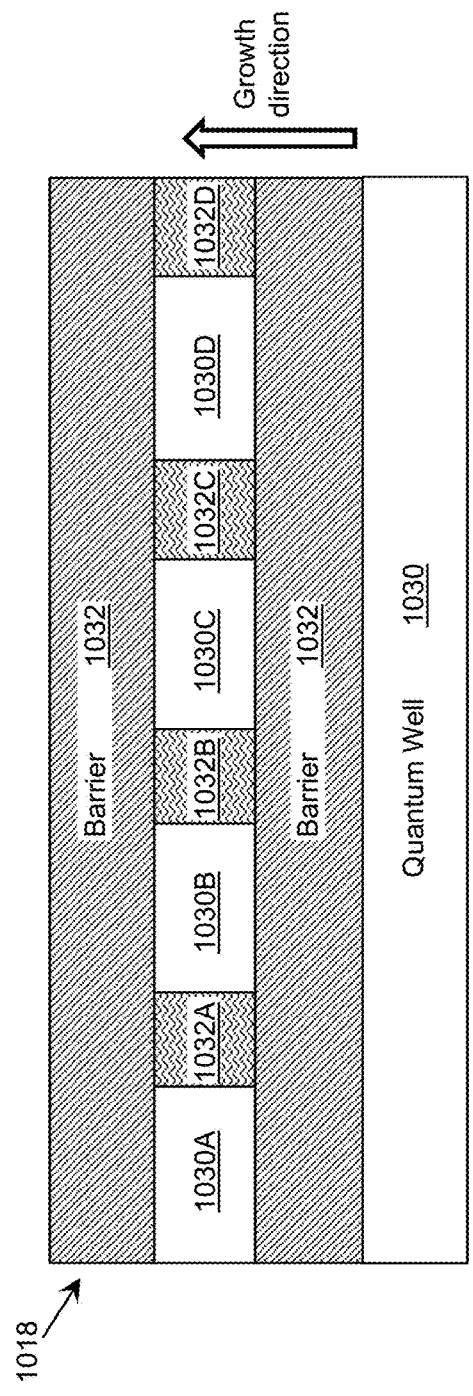
FIG. 10 shows an illustrative heterostructure including a set of laterally discrete subscale quantum wells according to an embodiment.

FIG. 10 shows an illustrative heterostructure 1018 including a fine structure region comprising a set of laterally discrete subscale quantum wells 1030A-1030D according to an embodiment. The subscale quantum wells 1030A-1030D are separated by a set of subscale barriers 1032A-1032D. The fine structure region including the laterally discrete subscale quantum wells 1030A-1030D can be located in a barrier layer 1032 in proximity to a laterally continuous (conventional) quantum well 1030, and can be configured to serve as carrier trapping centers in order to further localize carriers. The set of subscale barriers 1032A-1032D can allow for a variation of barrier band gap heights in the lateral direction. In an embodiment, the subscale quantum wells 1030A-1030D are adjacent to or within a distance of approximately ten percent of a thickness of the quantum well 1030. In an embodiment, the laterally discrete subscale quantum wells 1030A-1030D and/or subscale barriers 1032A-1032D have nanometer-size dimensions in the growth and/or lateral direction. In a further embodiment, the laterally discrete subscale quantum wells 1030A-1030D and/or subscale barriers 1032A-1032D can be as large as a few micrometers in the lateral direction.

Figure 11:
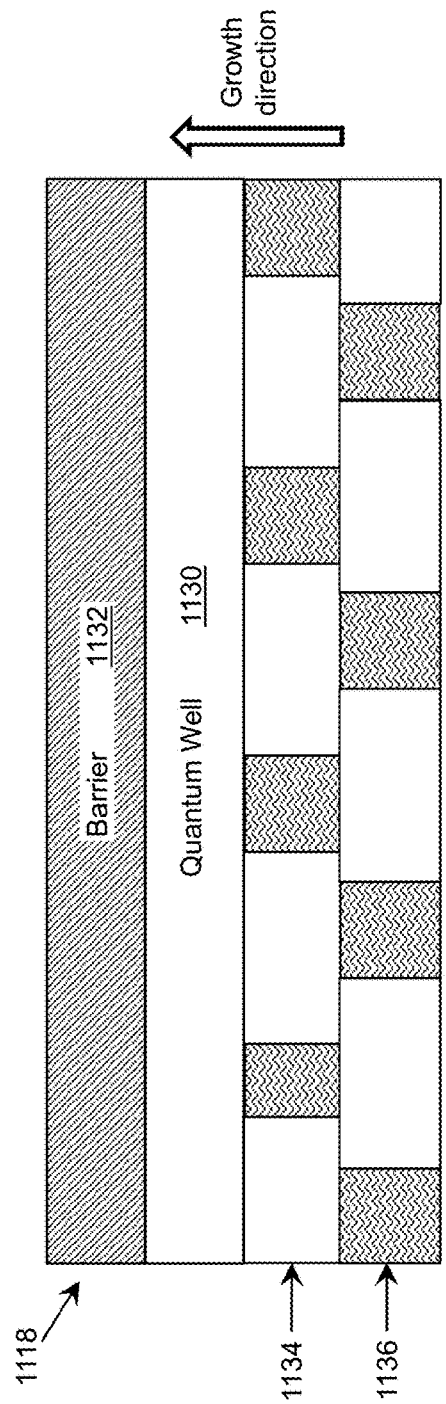
FIG. 11 shows another illustrative heterostructure including sets of laterally discrete subscale quantum wells according to an embodiment.

FIG. 11 shows another illustrative heterostructure 1118 including sets of laterally discrete subscale quantum wells 1134, 1136 according to an embodiment. In this case, the laterally discrete subscale quantum wells in each set of laterally discrete subscale quantum wells 1134, 1136 are laterally staggered from each other. To this extent, the set of laterally discrete subscale quantum wells 1136 is separated from a continuous quantum well 1130 by another set of laterally discrete subscale quantum wells 1134, which are staggered from the set of laterally discrete subscale quantum wells 1136. In this case, a carrier localized in a laterally discrete subscale quantum well is allowed to migrate into the continuous quantum well 1130 for subsequent recombination. The migration rate can be proportional to an overall overlap of the sets of laterally discrete subscale quantum wells 1134, 1136. In an embodiment, the laterally discrete subscale quantum wells and/or barriers are formed using pulsing epitaxial growth.

In an embodiment, a subscale feature can have a non-uniform composition in the growth and/or lateral directions. For example, a subscale layer (e.g., a subscale barrier or quantum well) and/or a subscale laterally discrete feature (e.g., a laterally discrete subscale quantum well or barrier) can have a graded composition. In this case, the composition of the subscale feature varies in the growth direction. Furthermore, a subscale feature can have a composition that is non-uniform in the lateral direction. The lateral non-uniformity can create a graded or discontinuous region corresponding to the subscale feature.

A fine scale structure described herein can be formed using any solution. In an embodiment, the fine scale structure is formed using an epitaxial growth process, such as metalorganic chemical vapor deposition (MOCVD), or the like, in which the V/III ratio is modulated during the epitaxial growth. In a more particular embodiment, a migration enhanced MOCVD epitaxial growth process is used and the V/III ratio is modulated in a range of approximately zero to approximately 6000 through modulation of $NH_3$. The epitaxial growth also can include pulsing epitaxial growth, e.g., through controlling the timing patterns of switch-on and switch-off metalorganic precursors and a nitrogen precursor (e.g., $NH_3$) to create a fine scale structure, which can be laterally discrete. Similarly, one or more other growth conditions can be modulated during the epitaxial growth. For example, the growth temperature can be modulated to create the fine scale structure(s). In an embodiment, during the epitaxial growth, a time periodic modulation of one or more growth conditions, such as the V/III ratio, growth temperature, and/or the like, can be used to grow a fine scale superlattice structure.

Figure 12:
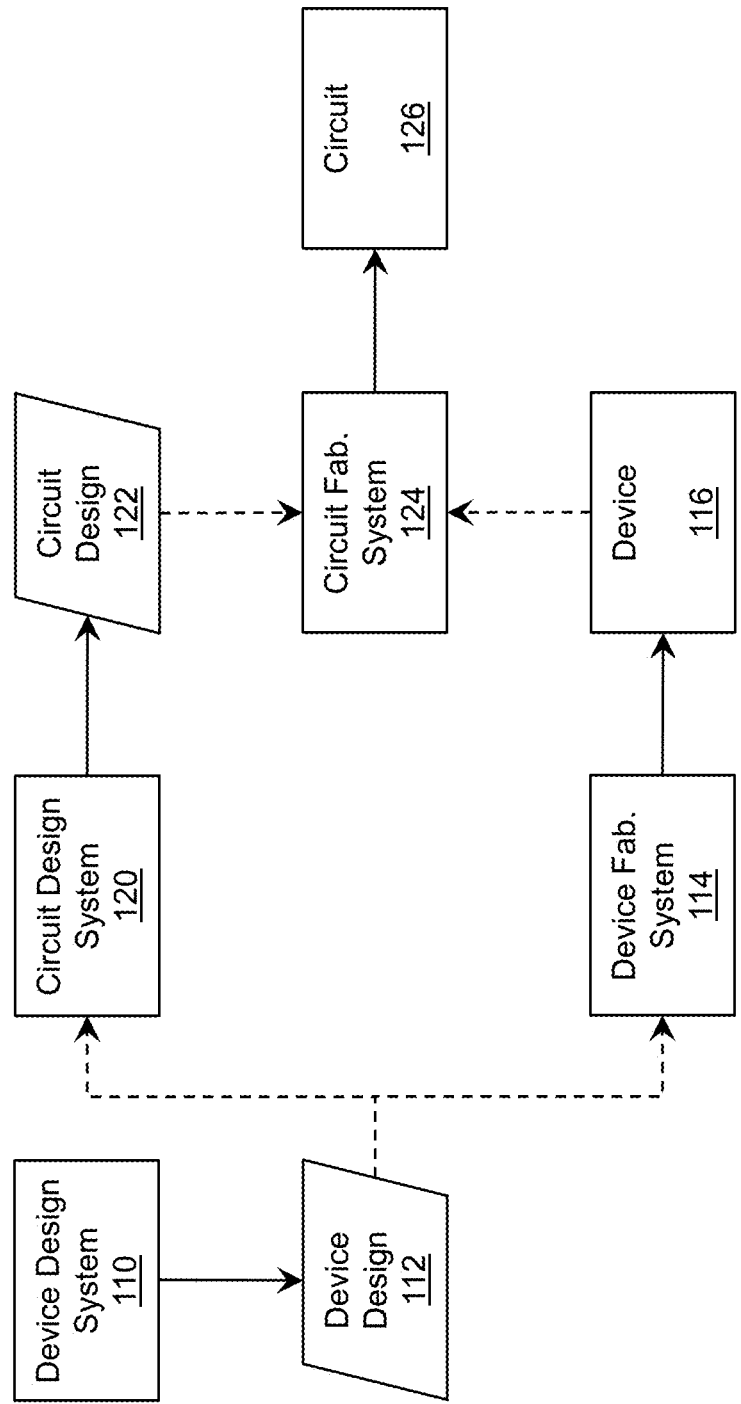
FIG. 12 shows an illustrative flow diagram for fabricating a circuit according to an embodiment.

In an embodiment, the invention provides a method of designing and/or fabricating a circuit that includes one or more of the devices designed and fabricated as described herein. To this extent, FIG. 12 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device, comprising:
    a semiconductor structure including a superlattice, wherein the superlattice includes:
        a plurality of first semiconductor layers alternating with a plurality of second semiconductor layers, wherein at least one of: a first semiconductor layer in the plurality of first semiconductor layers or a second semiconductor layer in the plurality of second semiconductor layers includes a plurality of regions including:
            a fine structure region located only in an outer portion of the at least one of: the first semiconductor layer or the second semiconductor layer, wherein the fine structure region includes a plurality of subscale features arranged in a growth direction, wherein the plurality of subscale features includes a plurality of subscale layers of a first band gap and a plurality of subscale layers of a second band gap, wherein the subscale layers of the first band gap alternate with the subscale layers of the second band gap, and wherein one of the subscale layers of the first band gap and the subscale layers of the second band gap include subscale layers of a plurality of distinct heights differing from each other.

2. The device of claim 1, further comprising a p-type semiconductor layer having a p-type doping, wherein the superlattice is located within the p-type semiconductor layer.

3. The device of claim 1, further comprising a substrate, a buffer layer formed over the substrate, an n-type semiconductor layer formed over the buffer layer, an active layer formed over the n-type semiconductor layer, and a p-type semiconductor layer formed over the active layer.

4. The device of claim 3, wherein the superlattice is located within the p-type semiconductor layer.

5. The device of claim 3, wherein the superlattice is located within the active layer, and wherein the superlattice comprises a light emitting multiple quantum well heterostructure.

6. A device, comprising:
    a semiconductor structure including a superlattice, wherein the superlattice includes:
        a plurality of first semiconductor layers alternating with a plurality of second semiconductor layers, wherein at least one of: a first semiconductor layer in the plurality of first semiconductor layers or a second semiconductor layer in the plurality of second semiconductor layers includes a plurality of regions including:
            a fine structure region including a plurality of subscale features having a graded composition that varies in the growth direction, wherein the plurality of subscale features include a plurality of subscale barriers alternating with a plurality of subscale quantum wells.

7. The device of claim 6, wherein at least some of the subscale features comprise a composition that varies in a lateral direction.

8. The device of claim 6, wherein the fine structure region includes a first plurality of laterally discrete subscale features of varying composition, wherein the fine structure region is adjacent to at least one of: a first semiconductor layer in the plurality of first semiconductor layers or a second semiconductor layer in the plurality of second semiconductor layers having a substantially contiguous lateral composition.

9. The device of claim 8, wherein the fine structure region further includes a second plurality of laterally discrete subscale features of varying composition, and wherein the second plurality of laterally discrete subscale features are laterally staggered from the first plurality of laterally discrete subscale features.

10. The device of claim 6, wherein the fine structure region is in the first semiconductor layer in the plurality of first semiconductor layers adjacent to a first semiconductor layer-second semiconductor layer heterojunction within the superlattice, and wherein a height of the subscale barriers in the fine structure region decrease decreases toward the heterojunction.

11. The device of claim 6, wherein the plurality of first semiconductor layers are barriers and the plurality of second semiconductor layers are quantum wells.

12. The device of claim 11, wherein the fine structure region is located in the first semiconductor layer in the plurality of first semiconductor layers, and wherein a height of each of the subscale barriers in the fine structure region is no higher than a barrier height of the first semiconductor layer in the plurality of first semiconductor layers.

13. The device of claim 11, wherein the fine structure region is located in the second semiconductor layer in the plurality of second semiconductor layers, and wherein a height of each of the subscale barriers in the fine structure region is higher than a quantum well depth of the second semiconductor layer in the plurality of second semiconductor layers and lower than a barrier height of each of a set of first semiconductor layers immediately adjacent to the second semiconductor layer.

14. The device of claim 6, wherein at least one of the plurality of subscale features is laterally non-uniform.

15. A device comprising:
    a group III nitride semiconductor structure including a superlattice, wherein the superlattice includes:
        a plurality of first semiconductor layers alternating with a plurality of second semiconductor layers, wherein at least one of: a first semiconductor layer in the plurality of first semiconductor layers or a second semiconductor layer in the plurality of second semiconductor layers includes a plurality of regions including:
            a fine structure region located only in an outer portion of the at least one of: the first semiconductor layer or the second semiconductor layer, wherein the fine structure region includes a plurality of subscale layers having alternating compressive and tensile stresses, wherein the compressive and tensile stresses in the plurality of subscale layers decrease in a direction toward a first semiconductor layer-second semiconductor layer heterojunction adjacent to the outer portion.

16. The device of claim 15, wherein the group III nitride semiconductor structure comprises aluminum gallium nitride materials.

17. The device of claim 16, wherein the first semiconductor layer in the plurality of first semiconductor layers is a barrier of a multiple quantum well structure including the fine structure region, and wherein at least one of the plurality of subscale layers has a higher gallium content than a gallium content of the first semiconductor layer.

18. The device of claim 16, wherein the second semiconductor layer in the plurality of second semiconductor layers is a quantum well of a multiple quantum well structure including the fine structure region, and wherein at least one of the plurality of subscale layers has a higher aluminum content than an aluminum content of the second semiconductor layer.

19. The device of claim 15, wherein the fine structure region further includes a plurality of subscale features arranged in a lateral direction.

20. The device of claim 15, further comprising a substrate layer, a buffer layer adjacent to the substrate layer, an n-type semiconductor layer over the buffer layer, an active layer over the n-type semiconductor layer, and a p-type semiconductor layer over the active layer, wherein the superlattice is located within at least one of: the active layer, the p-type semiconductor layer, or the n-type semiconductor layer.

* * * * *